United States Patent [19]
Ohmi et al.

[11] Patent Number: 6,007,970
[45] Date of Patent: Dec. 28, 1999

[54] LITHOGRAPHIC DEVELOPER CONTAINING SURFACTANT

[75] Inventors: Tadahiro Ohmi; Hisayuki Shimada; Shigeki Shimomura, all of Sendai, Japan

[73] Assignees: Canon Kabushiki Kaisha; Tadahiro Ohmi, both of Tokyo, Japan

[21] Appl. No.: 08/395,182

[22] Filed: Feb. 27, 1995

Related U.S. Application Data

[63] Continuation of application No. 08/181,972, Jan. 18, 1994, abandoned, which is a continuation of application No. 08/013,102, Feb. 3, 1993, abandoned.

[30] Foreign Application Priority Data

| Feb. 7, 1992 | [JP] | Japan | 4-057081 |
| Aug. 7, 1992 | [JP] | Japan | 4-233080 |
| Aug. 7, 1992 | [JP] | Japan | 4-233082 |

[51] Int. Cl.$^6$ .................................................. G03C 5/00
[52] U.S. Cl. ......................... 430/331; 430/326; 430/325
[58] Field of Search ................................... 430/331, 326, 430/325

[56] References Cited

U.S. PATENT DOCUMENTS

| 4,395,480 | 7/1983 | Sprintschnik | 430/309 |
| 4,670,372 | 6/1987 | Lewis et al. | 430/326 |
| 4,749,640 | 6/1988 | Tremont et al. | 430/314 |
| 4,945,030 | 7/1990 | Turner et al. | 430/331 |
| 5,030,550 | 7/1991 | Kawabe et al. | 430/331 |
| 5,106,724 | 4/1992 | Nogami et al. | 430/331 |

FOREIGN PATENT DOCUMENTS

| 056138 | 7/1982 | European Pat. Off. . |
| 178496 | 4/1986 | European Pat. Off. . |
| 259985 | 3/1988 | European Pat. Off. . |
| 0274044 | 7/1988 | European Pat. Off. . |
| 279630 | 8/1988 | European Pat. Off. . |
| 1129250 | 5/1989 | Japan . |

OTHER PUBLICATIONS

Patent Abstracts of Japan, vol. 13, No. 375, (P–921) Aug. 1989, for JP–A–1–129250.

*Primary Examiner*—Maria Nuzzolillo
*Assistant Examiner*—Laura Weiner
*Attorney, Agent, or Firm*—Fitzpatrick, Cella, Harper & Scinto

[57] ABSTRACT

Provided is a lithographic developer used to develop a resist pattern having regions with different sizes and shapes, by dissolving and removing a resist region of a resist layer formed in the resist pattern, wherein the developer comprises a surfactant capable of increasing the dissolution of a resist in the resist region to be dissolved and removed, having a smaller dissolving-and-removing area on the surface of the resist layer.

1 Claim, 21 Drawing Sheets

MASK 201

TEST PATTERN 202

0.6μm 0.7μm 0.8μm 1.0μm 0.4μm 0.5μm 0.6μm

WITHOUT O₃

WITH O₃

1.5μm

FIG. 10A
FIG. 10B
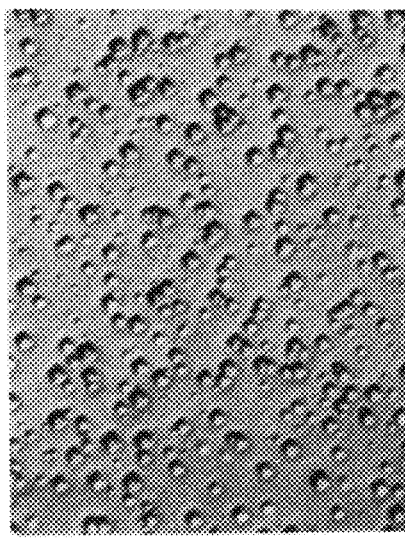
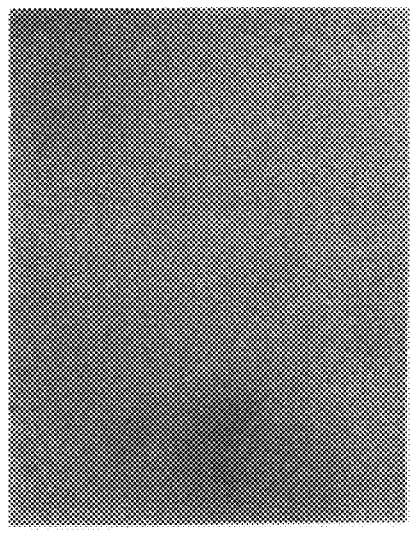
20 μm
23 °C

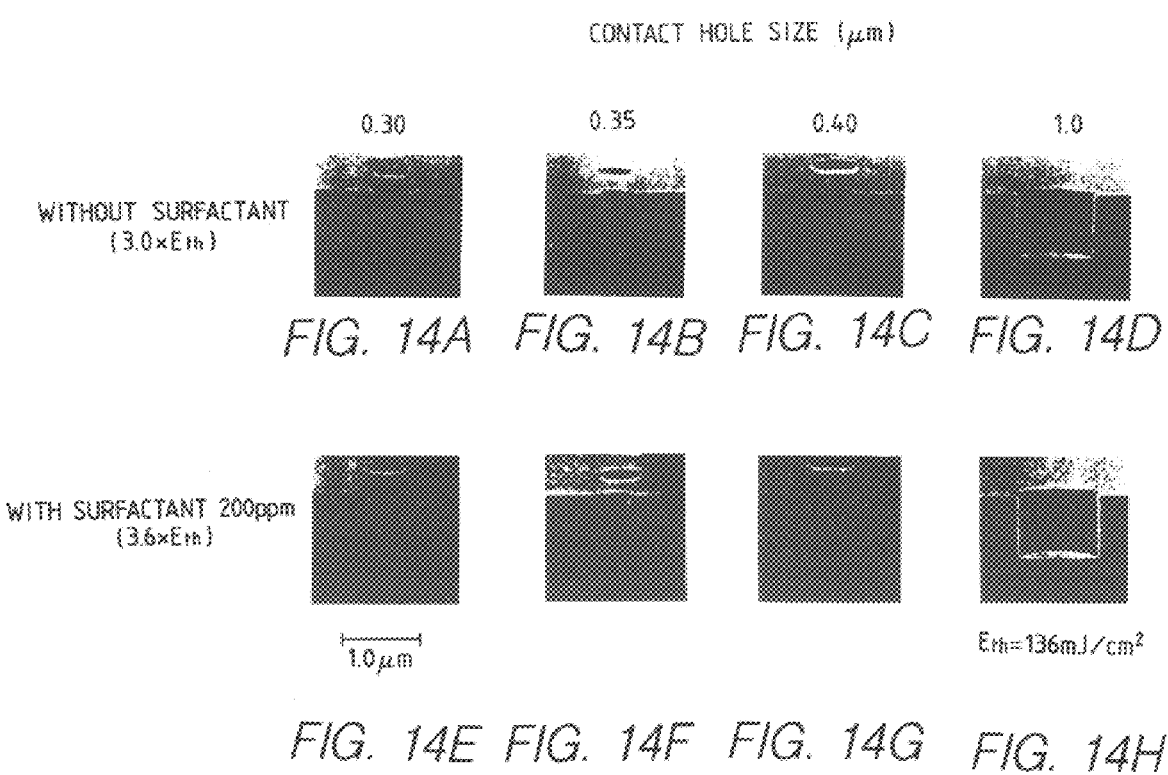

CONTACT HOLE SIZE (μm)

$E_{th} = 114 mJ/cm^2$

F-VALUE (μm)

WITHOUT SURFACTANT

WITH SURFACTANT 100ppm 0.35μm CONTACT HOLE          1.0μm

1μm

FIG. 21A
FIG. 21B
FIG. 21C
220mJ/cm²
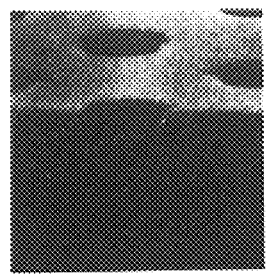
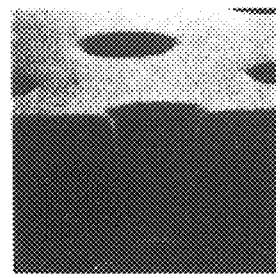
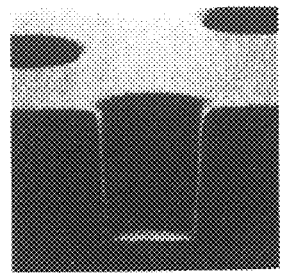
FIG. 21D
FIG. 21E
FIG. 21F
280mJ/cm²
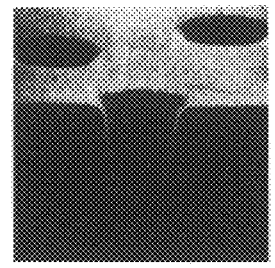
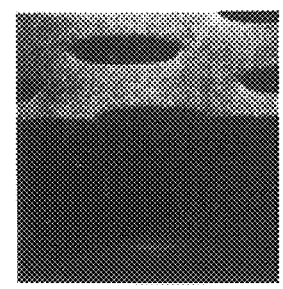
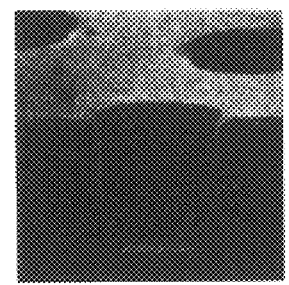
1.0μm          0.6μm          0.7μm          0.8μm 1.0μm  0.6μm  0.7μm  0.8μm

LITHOGRAPHIC DEVELOPER CONTAINING SURFACTANT

This application is a continuation of application Ser. No. 08/181,972 filed Jan. 18, 1994, now abandoned; which is a continuation of application Ser. No. 08/013,102, filed Feb. 3, 1993, now abandoned.

BACKGROUND OF THE INVENTION

1. Field of the Invention

The present invention relates to a lithographic developer (developing solution) and a lithographic process. More particularly, it relates to a lithographic developer and a lithographic process, suited for ultra large scale integration processing.

2. Related Background Art

In recent years, as semiconductor devices are made more highly dense and fine, it has been required in lithography to form fine resist patterns having a processing latitude. Hence, photoresists having a high resolution are used to form the patterns. Such resists are of a positive type or a negative type. In usual instances, the patterns are formed using an alkaline developer as exemplified by a 2.38% by weight aqueous solution of tetramethylammonium hydroxide (hereinafter "TMAH").

As resist materials have been made to have a higher resolving power, the ratio of dissolving rate at exposed areas of a resist layer to that at unexposed areas thereof, i.e., the selection ratio of a resist to a developer has been improved. The state thereof is shown in FIG. 16. In FIG. 16, the ratios of dissolving rate at exposed areas of a resist layer to that at unexposed areas thereof are shown as functions of TMAH concentration, in resists having different resolutions. In the drawing, a positive photoresist A has a resolution of 1.2 μm, a positive photoresist B, 0.8 μm, and a positive photoresist C, 0.6 μm. As shown in the drawing, the selection ratio a resist has is seen to exponential-functionally increases with an improvement in the resolution of the resist. In other words, an achievement of a resist having a high resolution is seen to be equal to an improvement in the selection ratio at exposed areas of a resist layer and unexposed areas thereof.

In order to improve developability, it is attempted to increase the concentration of a developer. Such an attempt, however, leads to a decrease in the selection ratio at exposed areas of a resist layer and unexposed areas thereof, resulting in a deterioration of the-resolution performance of resists.

FIG. 17 shows a 0.55 μm line-and-space resist pattern developed by a developer of a conventional type in which no surfactant is added. Exposure was carried out using a g-line reduction aligner having a lens with a numerical aperture of 0.43. Because of a poor wettability of the developer on the resist surface, trailing and residues (shown by the encircled portions, 1201, in FIG. 17) of the resist pattern are seen to have occurred after development. In order to prevent such a phenomenon, a developer containing a surfactant has been used in some instances. When, however, some types of substrates are used, none of conventional developers containing a surfactant can prevent the resist residues from occurring. Conversely, the addition of some types of surfactants has caused a decrease in the sensitivity of resists or a decrease in exposure latitude.

FIG. 18 shows the flatness of the surface of a silicon wafer having been immersed for 60 seconds in the developer of a conventional type in which no surfactant is added, which flatness is indicated as the central-line average roughness. As is seen therefrom, the wafer having been immersed in the developer has a very rough surface only because of its contact with the developer for a time as short as 60 seconds, compared with a reference wafer having not been immersed in the developer. Fabrication of semiconductor devices in such a state of surface brings about an extreme deterioration of electrical characteristics. FIG. 19 shows data obtained by examining a channel mobility of MOS transistors fabricated by the use of wafers having a rough surface. The channel mobility is seen to be extremely poor with respect to the reference value when the surface has roughed upon its contact with the developer.

The silicon surface can be prevented from roughing when a certain surfactant is added to the developer, but the surfactant is adsorbed onto the silicon. FIG. 20 shows data obtained by observing the carbon 1s peak by X-ray photoelectron spectroscopy (XPS). A peak 1501 that shows the presence of the surfactant was seen in the data from the silicon surface exposed for 60 seconds to the developer containing a surfactant. It was found that, when the developer containing a surfactant was used, the surfactant was adsorbed to the underlying substrate and was not removable by usual rinsing. Adsorption of the surfactant to the substrate surface caused a carbon contamination to bring about a lowering of film quality in the subsequent formation of various kinds of thin films. On the other hand, when a surfactant not adsorptive to the silicon surface was selected, the surface of silicon roughed.

Under existing circumstances, no resist can show its ability when contact holes are formed using a resist having a resolution up to 0.6 μm (capable of forming-line-and-space patterns with a mask fidelity).

FIGS. 21A to 21F show cross-sectional photographs of contact holes developed using a conventional developer. In the case of exposure conditions under which contact holes with a size of 0.8 μm are formed (220 mJ/cm$^2$), 0.7 μm and 0.6 μm holes are in a condition of under-exposure.

In the case of exposure conditions under which contact holes with a size of 0.7 μm are formed (280 mJ/cm$^2$), 0.8 μm holes are in a condition of over-exposure and 0.6 μm holes are in a condition of under-exposure. Namely, in regions having a smaller exposure area in themselves (e.g., hole regions), the developer had so poor a wettability that it did not penetrate into the resist pattern and hence no satisfactory resist performance was exhibited.

In order to improve the wettability of developers, developers containing a surfactant are used. FIG. 22 shows the relationship between the concentration of a surfactant added to a developer and the exposure threshold energy for the formation of contact holes. The contact hole exposure threshold energy is meant to be an exposure energy necessary for the bottom of a contact hole to reach the underlying substrate. The exposure threshold energy decreases with an increase in the concentration of the surfactant added to the developer, but the difference in exposure threshold energy between different hole sizes does not change from the state before the addition of the surfactant. Namely, when conventional surfactants are used, it Gas been impossible to form fine contact holes with different size, in a high precision under the same exposure conditions.

FIGS. 23A–C show cross-sectional photographs of contact holes formed using developers containing the surfactant as shown in FIG. 22. FIGS. 23A–C show that when the conventional surfactants are added the side walls of contact holes have a curved shape. When the amount of a conventional surfactant added was increased to improve the wettability of the developer, a deterioration of hole configuration occurred.

SUMMARY OF THE INVENTION

The present invention was made taking account of what have been discussed above. An object thereof is to provide a lithographic developer and a lithographic process, capable of developing a fine resist pattern having all regions with different sizes and shapes, as originally designed.

The lithographic developer of the present invention is characterized by a lithographic developer used to develop a resist pattern having regions with different sizes and shapes, by dissolving and removing a resist region of a resist layer formed in the resist pattern, wherein said developer comprises a surfactant capable of increasing the dissolution of a resist in the resist region to be dissolved and removed, having a smaller dissolving-and-removing area on the surface of said resist layer.

The lithographic process of the present invention is characterized by a process comprising the step of dissolving and removing a resist region of a resist layer formed in a resist pattern, to develop a resist pattern having regions with different sizes and shapes, wherein a lithographic developer comprising a surfactant capable of increasing the dissolution of a resist in the resist region to be dissolved and removed, having a smaller dissolving-and-removing area on the surface of said resist layer, is used in at least part of the development of said resist pattern.

BRIEF DESCRIPTION OF THE DRAWINGS

FIG. 9A: Before rinsing

FIG. 9B: After rinsing

FIGS. 10A and 10B are photographs each showing how the silicon surface roughs when the developer of the present invention or a conventional developer is used.

FIG. 10A: Conventional developer

FIG. 10B: Developer of the present invention

FIGS. 14A to 14H and 14I to 14P are electron microscopic photographs each showing the effect a surfactant in a developer has on the shape of holes when contact holes with different sizes are formed.

FIG. 14A: Resist MCPRi6600

FIG. 14B: Resist THMRip1800

FIG. 15A: Resist MCPRi6600

FIG. 15B: Resist THMRip1800

FIGS. 21A to 21C and 21D to 21F show photographs showing profiles of contact holes formed using a conventional developer.

DETAILED DESCRIPTION OF THE PREFERRED EMBODIMENTS

In the present invention, a developer containing a surfactant capable of increasing the dissolution of a resist in a smaller resist region is used. Hence, when a resist pattern formed by projecting using a patterning apparatus a pattern having regions with different size is developed using this developer, the surfactant is adsorbed to the resist surface. Then, because of the presence of the surfactant in fine regions into which liquid usually does not readily penetrate, the development proceeds through the same process as in regist regions having a relatively large area in the pattern. Hence, without regard to the size and shape of resist regions, a fine resist pattern having regions with different sizes and shapes can be developed as originally designed, so that it becomes possible to provide LSIs with much ultra-higher density and much ultra-higher speed.

The surfactant used in the above lithographic developer and lithographic process may preferably be a surfactant having anti-foaming properties.

The surfactant may preferably be, for example, an amine type surfactant having an ethylene oxide-propylene oxide block in a branched chain group, and a surfactant having an amine group, an ethylene oxide group and a propylene oxide group as hydrophilic groups. The concentration of the surfactant may preferably be 300 ppm or more.

The surfactant used in the present invention may particularly preferably be a surfactant of the formula

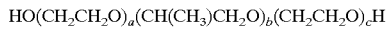
(I)

wherein a, b and c are each a positive integer.

A surfactant satisfying the following expression is more preferred:

$$(A+C)/(A+B+C) \leq 0.3$$

where A is a formula weight of a moiety $HO(CH_2CH_2O)_a$, B is a formula weight of a moiety $(CH(CH_3)CH_2O)_b$, and C is a formula weight of a moiety $(CH_2CH_2O)_cH$ in the Formula (I), respectively. The molecular weight of the surfactant may preferably be not more than 4,000. The surfactant in the developer may preferably be in a concentration of from 100 ppm to 1,000 ppm.

Figure 11:
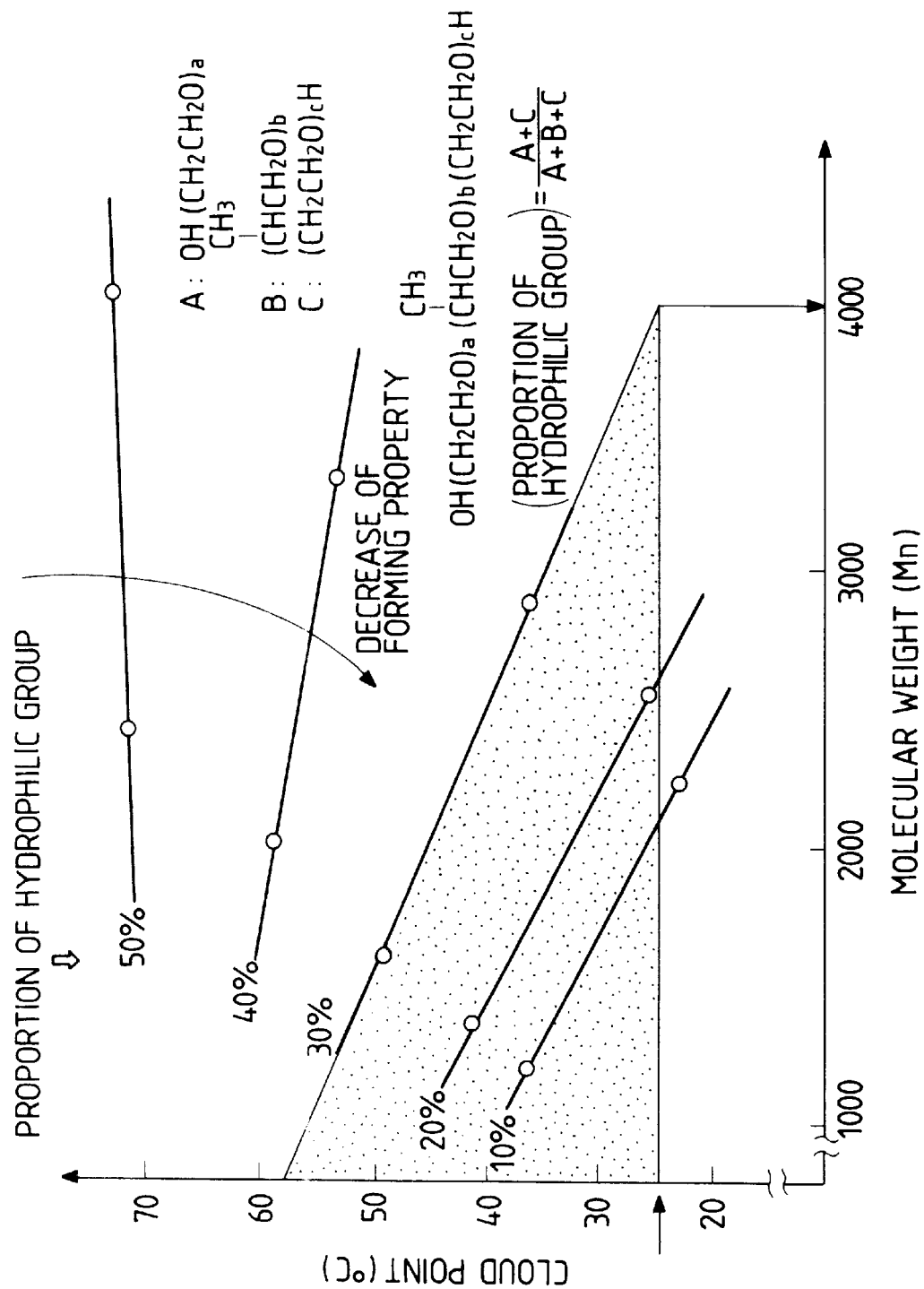
FIG. 11 is a graph showing the relationship between molecular weight of the surfactant used in the present invention, a proportion of hydrophilic groups [(A+B)/(A+B+C)], foaming properties, and a cloud point.

As the surfactant used in the present invention, the surfactant represented by Formula (I) is preferred. Making optimum the structure and molecular weight of the surfactant enables better prevention of the foaming that may occur during development, and also enables better prevention of a film loss at unexposed areas, so that a fine pattern can be formed in a very high precision. FIG. 11 shows the relationship between molecular weight of the surfactant, a proportion of hydrophilic groups [(A+B)/(A+B+C)], foaming properties, and a cloud point. As is clear from FIG. 11, the foaming properties decrease as the proportion of hydrophilic groups is made smaller. No foaming comes to occur at all at 30%, and there is no faulty pattern due to foaming. The cloud point can be 25° C. or above when the surfactant has a molecular weight of not more than 4,000. There is no influence of deposition of the surfactant under usual developing conditions, and a pattern can be formed in a high precision.

In the above lithographic process, the resist may be exposed to light using a g-line or i-line reduction aligner.

The surfactant adsorbed on the resist surface or the substrate underlying the resist may preferably be removed using ultra pure water containing not less than 0.1 ppm of ozone. In such a case, the ozone in the ultra pure water may preferably be in a concentration of not less than 2.0 ppm.

The present invention can be remarkably effective especially when the resist pattern has a resist region size of 0.5 μm or less.

The wettability can be more improved when the surfactant is added in a concentration of not less than 100 ppm, so that a random pattern having different resist regions mixedly present therein can be formed with greater ease. The upper limit of its concentration is 1,000 ppm in view of the solubility of the surfactant.

EXAMPLE 1

A first embodiment of the present invention will be described with reference to the accompanying drawings.

Figure 1:
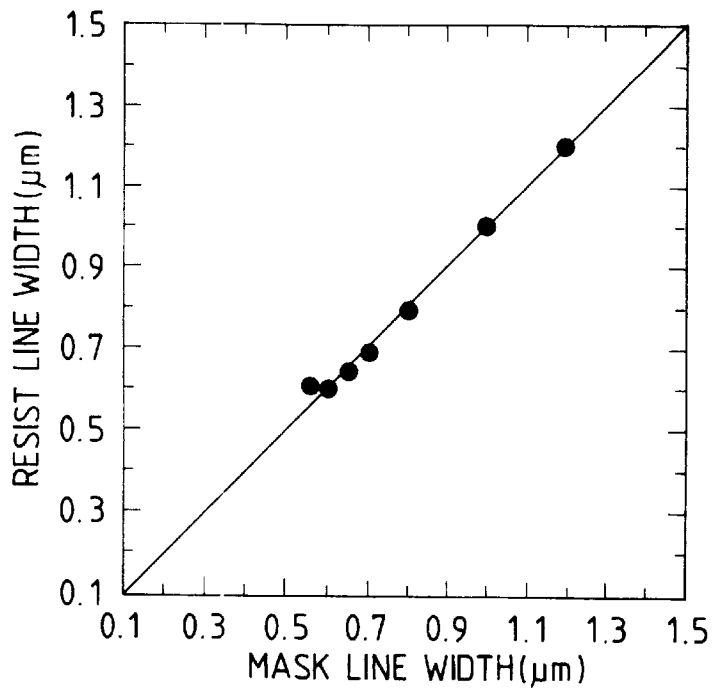
FIG. 1 is a graph showing the mask fidelity of a resist pattern developed using the developer of the present invention.

FIG. 1 shows the design fidelity of a line-and-space resist pattern exposed by means of a g-line reduction aligner with a numerical aperture of 0.43 and developed using the developer (TMAH content: 2.38% by weight) of the present Example. A positive resist (TSMR-V50, trade name, available from Tokyo Ohka Kogyo Co., Ltd.) has a resolution of 0.6 μm, provided that it does not particularly matter what sort of resist is used in the developing step in which the developer of the present invention is used.

The surfactant used in the present Example is an amine type anti-foaming surfactant having an ethylene oxide-propylene block in a branched chain group. Any lithographic developer may be used so long as it contains the surfactant capable of Increasing the dissolution of a resist in a smaller resist region. That is, in a developer used to develop a resist pattern having regions with different sizes and shapes, by dissolving and removing a resist region of a resist layer formed in the resist pattern, any surfactant may be used so long as it is capable of increasing the dissolution of a resist in the resist region to be dissolved and removed, having a smaller dissolving-and-removing area on the surface of said resist layer.

Using these resist and developer, contact holes were formed through a developing step, and were thereafter observed on a scanning electron microscope.

Figure 2A:
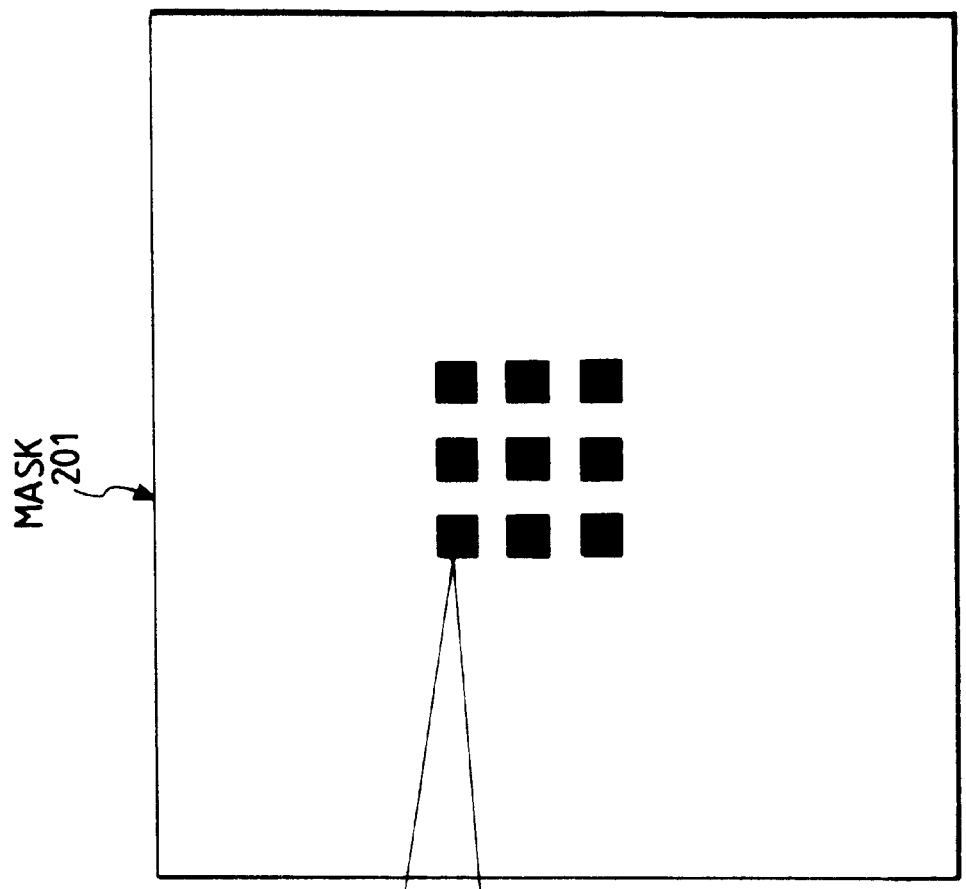
FIGS. 2A and 2B are a diagrammatic illustration of a transfer mask used in the designing of contact holes.
Figure 2B:
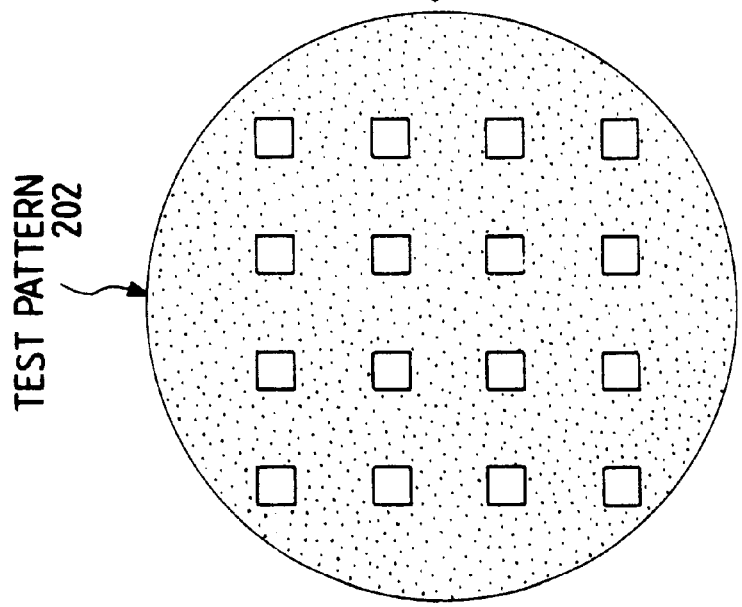

FIGS. 2A and 2B illustrates a transfer mask used in the designing of contact holes. FIG. 2B is an enlarged view of one hold in mask 201. Their actual size corresponds to the size of ⅕ on a mask 201. On an n-type (100) silicon substrate of 5 inches diameter, a positive resist layer (resist: TSMR-V50, trade name, available from Tokyo Ohka Kogyo Co., Ltd.) with a layer thickness of 1.26 μm was formed. Using a g-line reduction aligner having a lens with a numerical aperture of 0.43, 5:1 reduction projection of the test pattern 202 was made on the surface of the sample through the above mask 201. Difference in type of resist patterning apparatus has no influence in the present invention and hence other apparatus may be used.

Thereafter, the sample was immersed in the developer of the present Example for 70 seconds, followed by rinsing for 60 seconds with ultra pure water to form holes. Distance between holes was twice the hole size. For example, in the case of holes of 0.6 μm size, the distance between them was 1.2 μm. In this experiment, in the first place, holes of from 1 μm to 0.6 μm size were formed.

Figure 3:
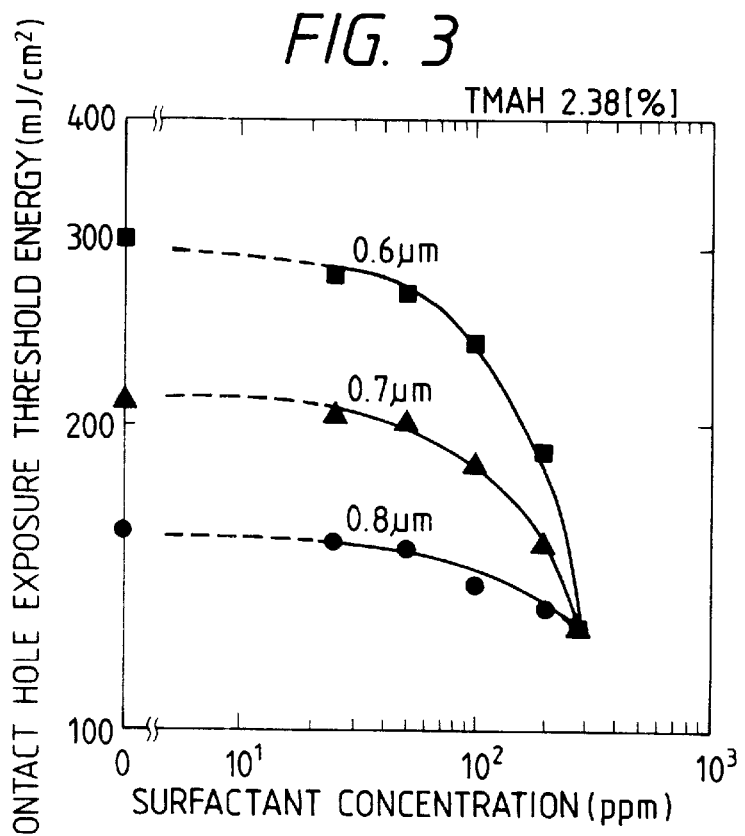
FIG. 3 is a graph showing the dependence of the concentration of a surfactant on the exposure threshold energy for the formation of contact holes in Example 1.

FIG. 3 shows the dependence of the concentration of the surfactant on the exposure threshold energy for the formation of the contact holes. With an increase in the surfactant, a remarkable decrease in exposure threshold energy was seen in the case of holes with a smaller size. More specifically, in the case of 0.8 μm holes, the dependence of the concentration of the surfactant on the exposure threshold energy was not so greatly seen. On the other hand, as the hole size became as smaller as 0.7 μm and as 0.6 μm, the exposure threshold energy remarkably decreased with an increase in the concentration of the surfactant. It was possible to form contact holes with a size of up to 0.6 μm under the same exposure conditions when the surfactant was added in a concentration of not less than 300 ppm. This phenomenon is attributable to the employment of the developer of the present Example, having the capability of increasing the dissolution of the resist in the resist region with a smaller size.

Figure 4A:
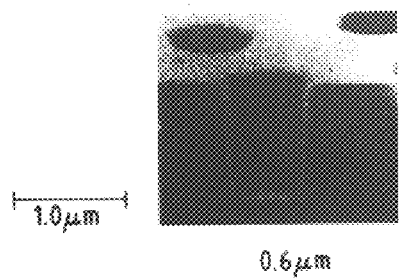
FIGS. 4A–4C show photographs showing profiles of 0.8 μm, 0.7 μm and 0.6 μm contact holes formed using a g-line reduction aligner with an NA value of 0.43 and the developer of the present invention.
Figure 4B:
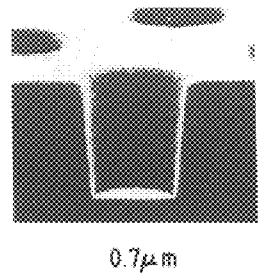
Figure 4C:
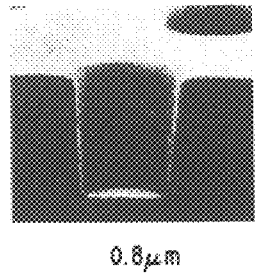

Next, cross sections of the holes were observed using a scanning electron microscope. FIGS. 4A–4C show profiles of 0.8 μm, 0.7 μm and 0.6 μm contact holes. Hole side walls were curved when conventional developers were used, but hole side walls were sharp in their shape in the case of the developer used in the present Example. This phenomenon is attributable to the following: The developer selectively penetrates into fine regions, and a dissolved reaction product swiftly diffuses and is removed from the resist surface, so that a fresh developer is more quickly fed as the resist region is smaller, and hence the development proceeds through the same process as in regist regions having a relatively large area in the resist pattern.

Figure 5A:
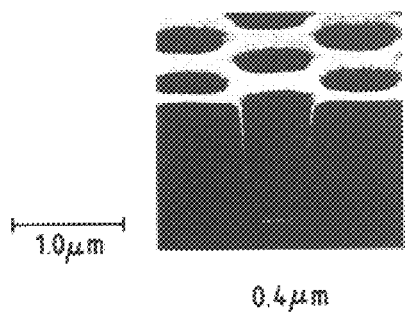
FIGS. 5A–5C show photographs showing profiles of 0.6 μm, 0.5 μm and 0.4 μm contact holes formed using a g-line reduction aligner with an NA value of 0.55 and the developer of the present invention.
Figure 5B:
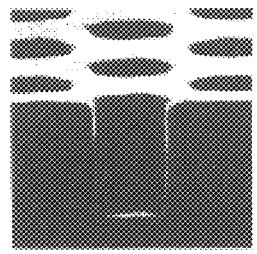
Figure 5C:
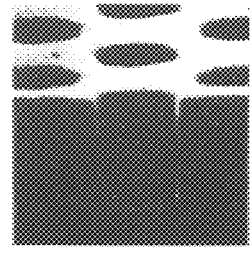

Next, using a g-line reduction aligner having a lens with a numerical aperture of 0.55, manufactured for the formation of high-resolution patterns, contact holes of up to 0.4 μm size were formed. FIG. 5 shows cross-sectional photographs of 0.6 μm, 0.5 μm and 0.4 μm contact holes. Exposure energy was 280 mJ/cm$^2$. The exposure was carried out under the same conditions.

As is clear from FIG. 5, the employment of the developer of the present Example enabled accurate formation of good holes up to 0.4 μm holes under the same exposure conditions, which had been hitherto impossible. This phenomenon is achieved by the developer having the effect of increasing development capability as resist patterns are too finer to be developed with ease.

From the above results, it has been confirmed that the developer of the present Example can develop, as originally designed, fine resist patterns having regions of, in particular, 0.5 μm or less even by means of a g-line reduction aligner, without regard to the sizes and shapes of regist regions.

EXAMPLE 2

A second embodiment of the present invention will be described with reference to FIGS. 6 to 10B.

Figure 6:
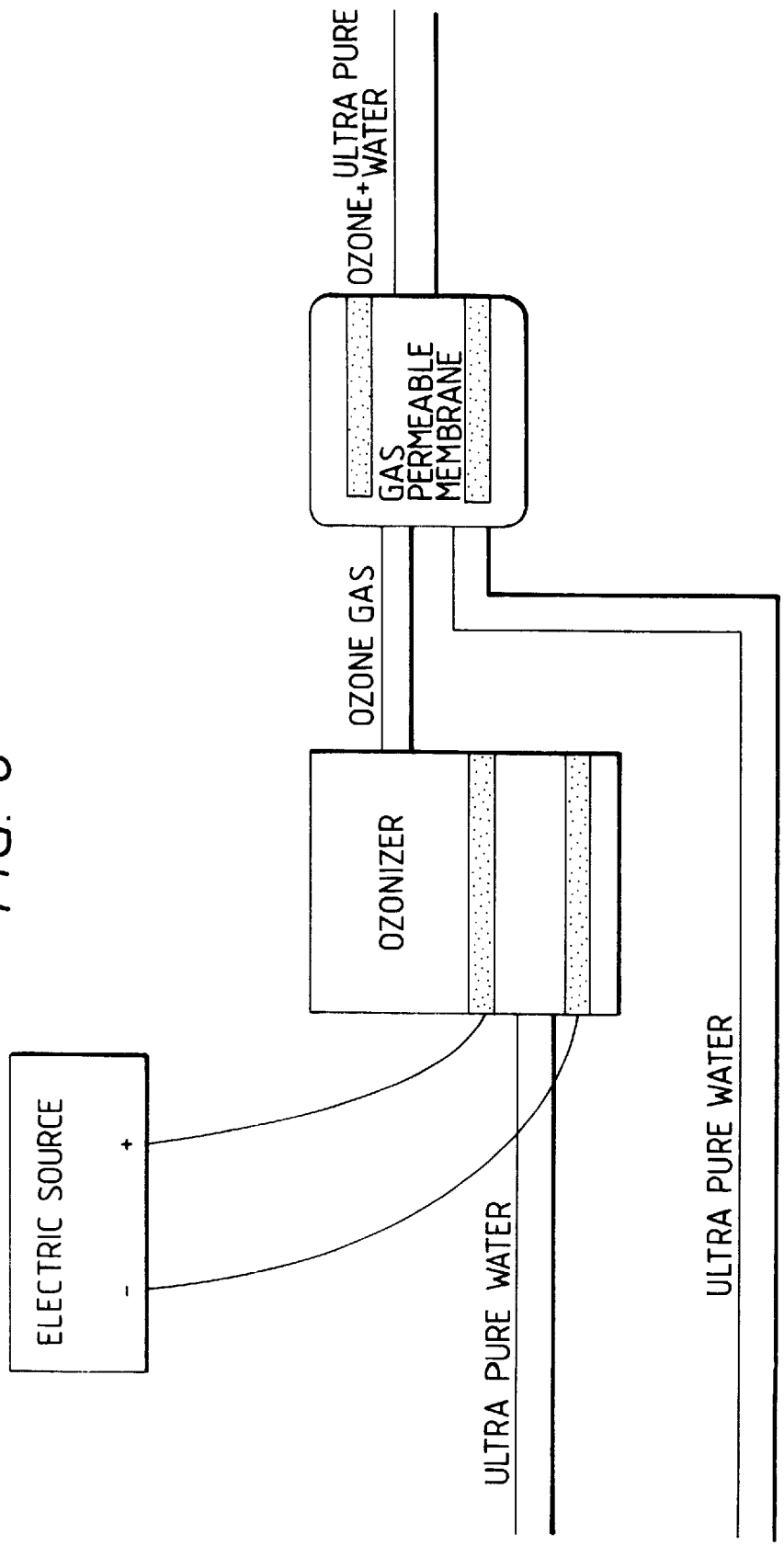
FIG. 6 is a conceptional illustration of a process for producing an ozone-containing ultra pure water.

FIG. 6 is a conceptional illustration of a process for producing an ozone-containing ultra pure water, which is used in rinsing with an ozone-containing ultra pure water in the present Example. In the apparatus shown in FIG. 6, ozone is generated by electrolysis of ultra pure water and is dissolved in ultra pure water separately fed. A commercially available apparatus is used as an ozone generator (ozonizer), and no special means is taken. Use of this apparatus enables well precise and stable supply of ultra pure water containing ozone in a concentration of up to 0.01 to 10 ppm.

Figure 7A:
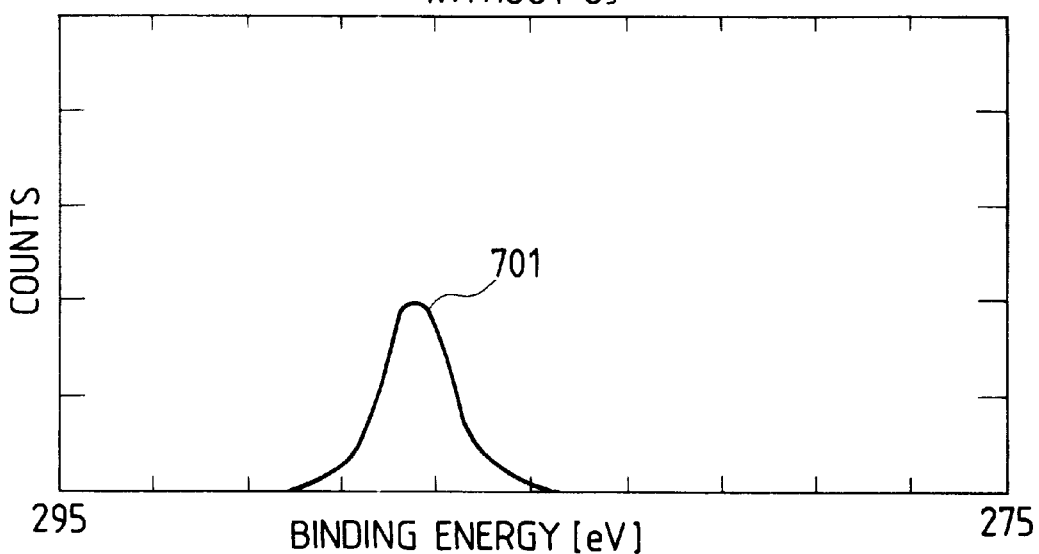
FIGS. 7A and 7B are XPS spectra showing that a surfactant can be removed from the silicon surface by rinsing with an ozone-containing ultra pure water.
Figure 7B:
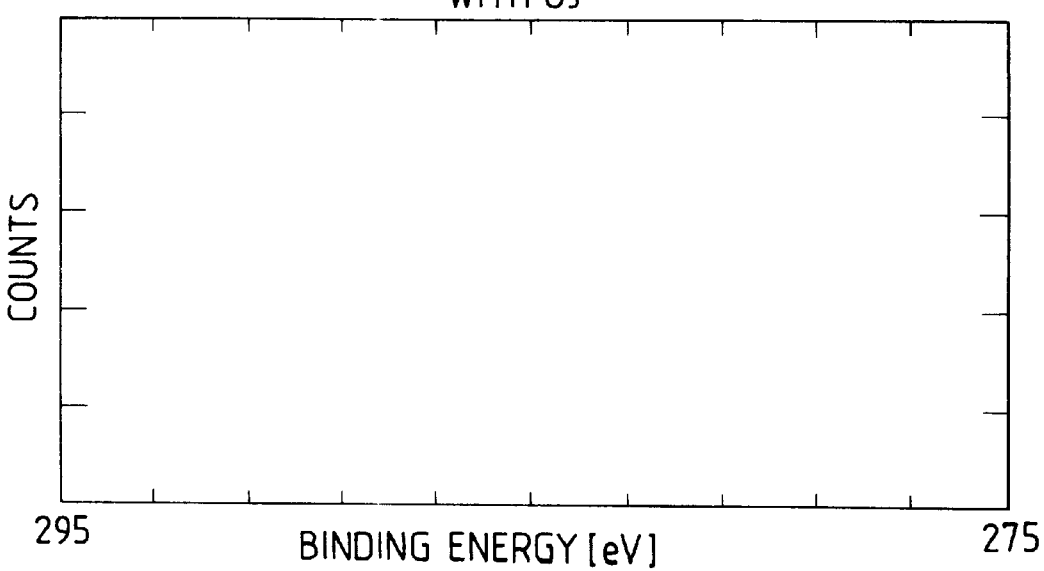

FIGS. 7A and 7B show data of X-ray photoelectron spectroscopic analysis of the carbon 1s peaks obtained from a sample of a silicon wafer immersed for 60 seconds in the developer used in the present invention and thereafter rinsed with water for 60 seconds, and a sample treated similarly but rinsed with ultra pure water containing 2 ppm of ozone. In the rinsing with ultra pure water, a surfactant peak 701 is seen from the silicon surface, but in the rinsing with the ultra pure water containing 2 ppm of ozone no surfactant peak 701 is seen. It has been confirmed that the surfactant adsorbed to the silicon surface is decomposed and removed by rinsing with the ozone-containing ultra pure water at room. temperature. It has been also confirmed that the same effect is obtained by carrying out the rinsing for 10 minutes even when the ozone is added to the ultra pure water in a concentration of 0.1 ppm.

Figure 8:
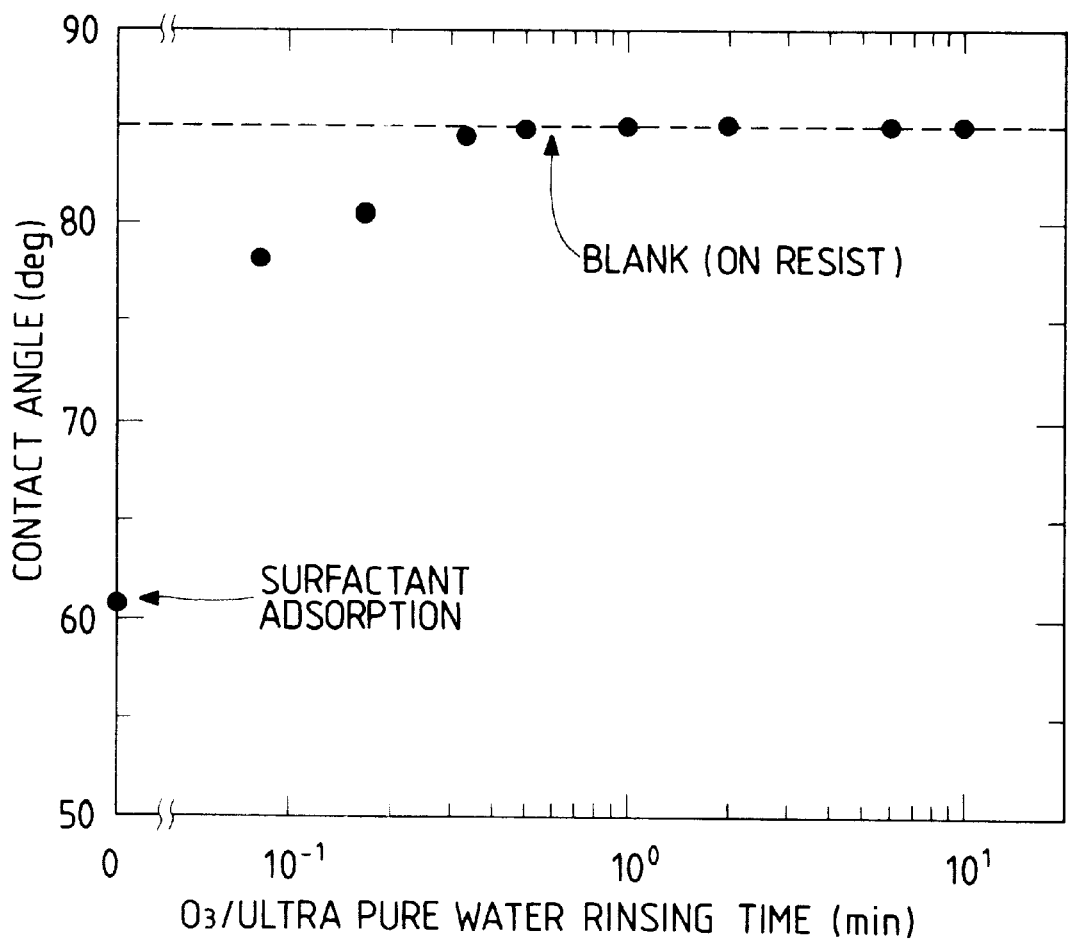
FIG. 8 is a graph showing, according to measurement of contact angle, that a surfactant can be removed from the silicon surface by rinsing with an ozone-containing ultra pure water.

Next, samples on which an unexposed positive resist thin film had been formed were immersed for 60 seconds in the developer containing the surfactant of the present invention, until the surface adsorbed the surfactant. Thereafter, the samples were treated with the ultra pure water containing 2 ppm of ozone, and contact angles of the ultra pure water to the surfaces of the samples were examined. FIG. 8 shows the relationship of an ozone-containing ultra pure water rinsing time and an ability of removing the surfactant from the resist surface. Since the surfactant is adsorbed to the resist surface before the rinsing with ultra pure water containing 2 ppm of ozone, the contact angle is in a lower value than the value on a clean resist surface. It, however, has been confirmed that as a result of rinsing for 60 seconds or longer the contact angle comes in a complete agreement with the value of the contact angle on the clean resist surface and thus the surfactant can be removed.

Figure 9A:
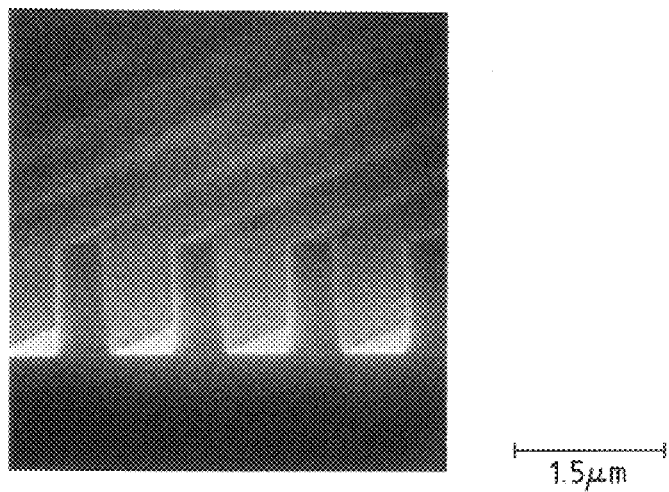
FIGS. 9A and 9B are photographs showing a 0.6 μm line-and-space pattern after rinsing with an ozone-containing ultra pure water.
Figure 9B:
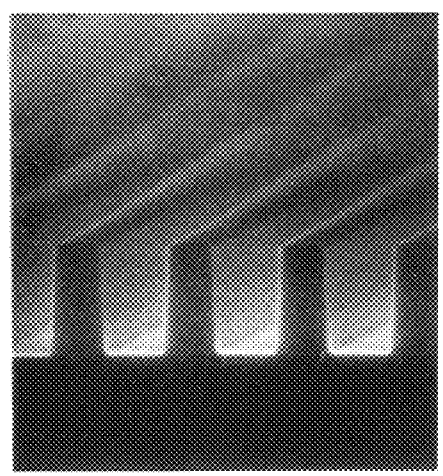

FIGS. 9A and 9B show profiles of 0.6 μm resist patterns before and after the rinsing with ultra pure water containing 2 ppm of ozone. No difference is seen between the profiles of 0.6 μm line with resist patterns before and after the rinsing with ultra pure water containing 2 ppm of ozone. It has been confirmed that there is no bad influence such as deformation of resist patterns caused by ozone.

FIGS. 10A and 10B show photographs of surfaces of silicon wafers immersed for 30 minutes in the developer used in the present invention and the conventional developer, respectively, followed by rinsing with ultra pure water containing 2 ppm of ozone. It has been confirmed that the silicon surface roughs when immersed in the conventional developer containing no surfactant, but the silicon surface does not rough in the case of the developer used in the present invention.

EXAMPLE 3

In this Example, developers prepared by adding to a developer NMD-3 (trade name; TMAH content: 2.38% by weight; available from Tokyo Ohka Kogyo Co., Ltd.) a surfactant (EPAN610, trade name, available from Daiichi Kogyo Seiyaku Co., Ltd.; (A+C)/(A+B+C)=0.1; molecular weight: 1,944) in various concentrations were used. As resists, MCPRi6600 and THMRip1800, available from Mitsubishi Chemical Industries Limited, were used.

In the same manner as in Example 1, a resist layer with a thickness of 1.085 μm was formed on each n-type (100) silicon substrate of 5 inches diameter. Thereafter, using a g-line reduction aligner having a lens with a numerical aperture of 0.55, 5:1 reduction projection of the test pattern 202 was made on the surface of each sample through the mask 201. Then the samples were dipped in the various developers for various hours.

For comparison, similar experiments were made using the developer NMD-3 containing no surfactant and a developer containing the conventional surfactant.

Figure 12:
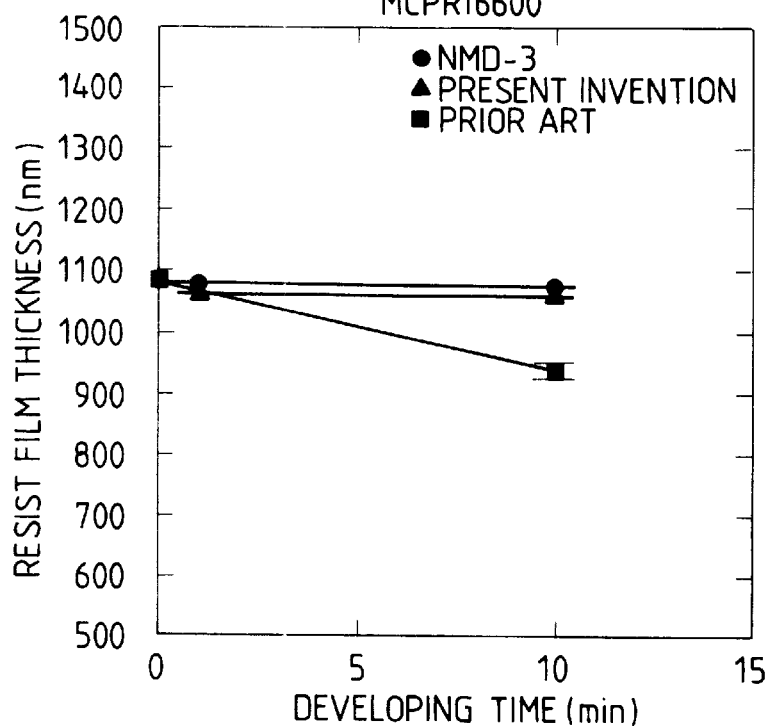
FIG. 12 is a graph showing the relationship between a resist film thickness and a developer immersion time.

FIG. 12 shows the relationship of developing time and resist film loss. As shown in the drawing, film loss extremely occurred when the developer containing the conventional surfactant was used. On the other hand, film loss little occurred even after 10 minutes when the developer of the present Example was used, as in the case of the developer containing no surfactant, and there was found to be no problem at all when the development was carried out for a usual time (about 1 minute). FIG. 12 shows an instance in which MCPRi6600 was used as the resist. It was also confirmed that no film loss occurred when THMRip1800 was used.

Figure 13:
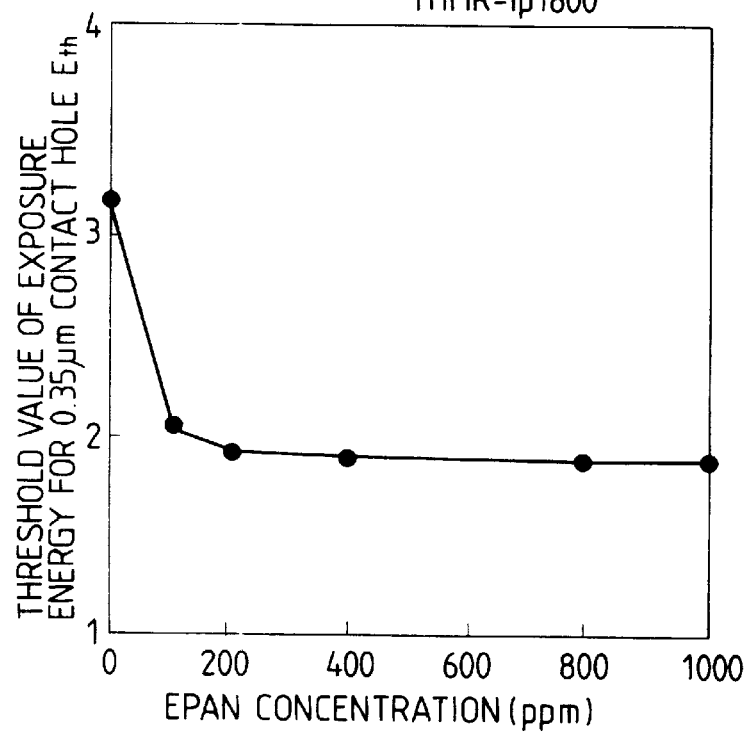
FIG. 13 is a graph showing the relationship between an exposure threshold energy required for the formation of contact holes and a concentration of a surfactant in a developer.
Figures 14I, 14J, 14K, 14L:
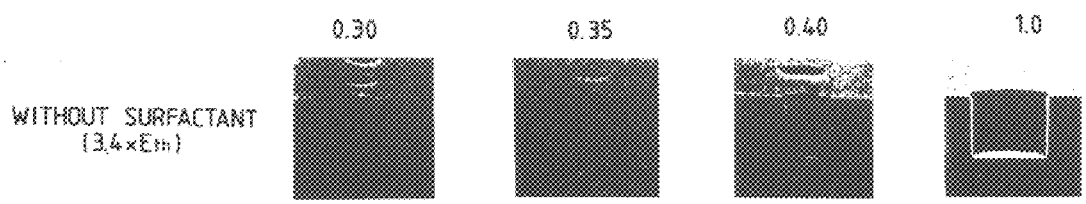
Figures 14M, 14N, 14O, 14P:
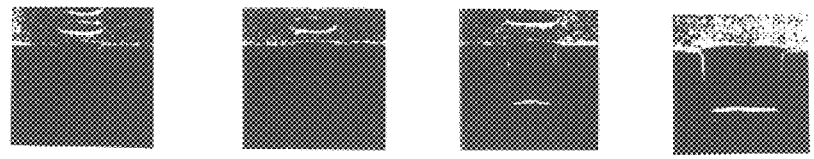

Next, the relationship between the exposure threshold energy necessary for the formation of contact holes with various size and the concentration of the surfactant was examined. As a result, the difference in exposure threshold energy in accordance with individual contact holes decreased with an increase in the amount of the surfactant added. It was also found that as shown in FIG. 13 the exposure threshold energy was kept constant within the range of from 100 ppm to 1,000 ppm.

Exposed samples were dipped for 70 seconds in the developer of the present Example and the developer containing no surfactant, respectively, followed by rinsing with ultra pure water for 60 seconds. Contact holes of the samples thus treated were observed using a scanning electron microscope. Results obtained are shown in FIGS. 14A to 14H and 14I to 14P.

as is clear from FIGS. 14A to 14H and 14I to 14P, for both the resists MCPRi6600 and THMRip1800, the employment of the developer of the present Example enabled accurate formation of good patterns having 0.3 μm to 1.0 μm holes mixedly present therein, under the same exposure conditions, which had been hitherto impossible.

In the present Example, EPAN610 was used as the surfactant. The same results were also obtained when EPAN420 (molecular weight: 1,200; proportion of hydrophilic groups: 20%) and EPAN720 (molecular weight: 2,000; proportion of hydrophilic groups: 20%) were used, which have different molecular weight and hydrophilic group proportion.

EXAMPLE 4

Contact holes of 0.35 μm size were formed in the same manner as in Example 3, but under exposure at varied focal points using the g-line reduction aligner.

Figures 15A, 15B, 15C, 15D, 15E, 15F:
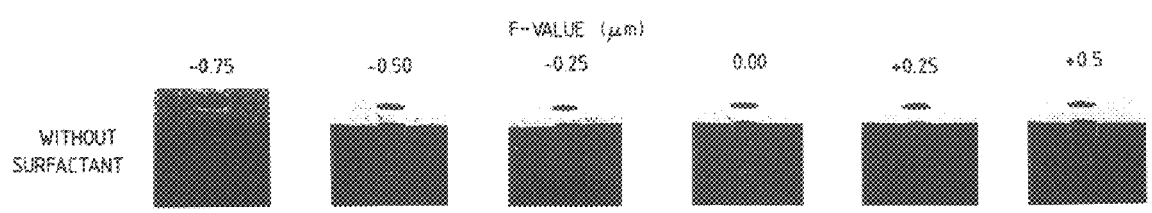
FIGS. 15A to 15L and 15M to 15X are electron microscopic photographs showing 0.35 μm contact holes formed using the developer of Example 3, under exposure applied in varied focal positions.
Figures 15G, 15H, 15I, 15J, 15K, 15L:
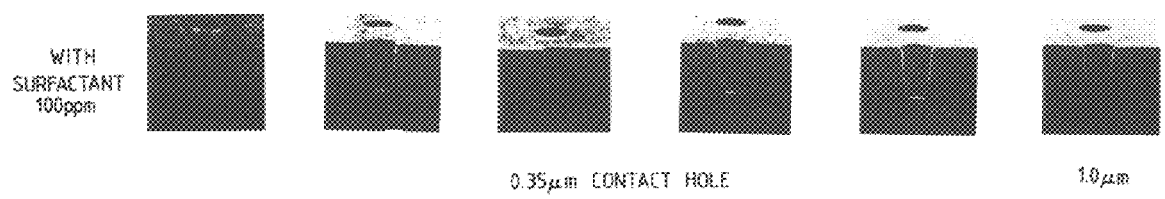
Figures 15M, 15N, 15O, 15P, 15Q, 15R:
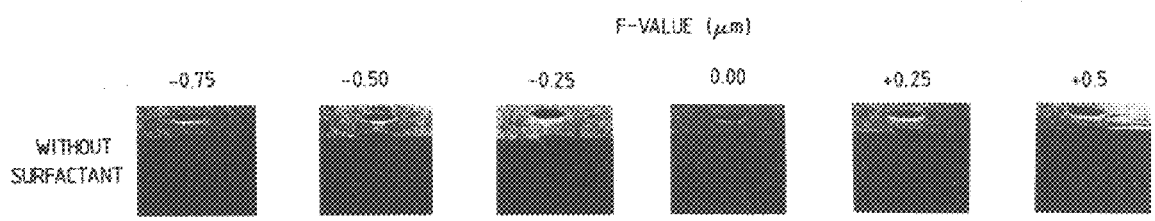
Figures 15S, 15T, 15U, 15V, 15W, 15X:
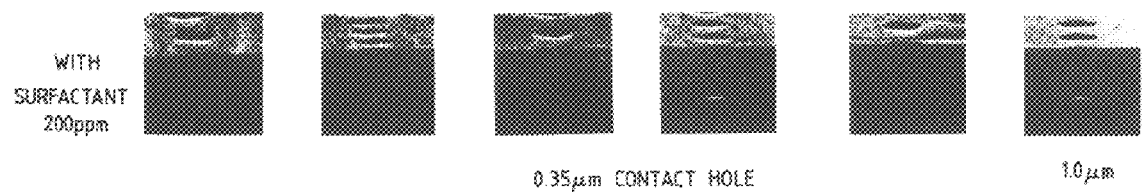
Figure 16:
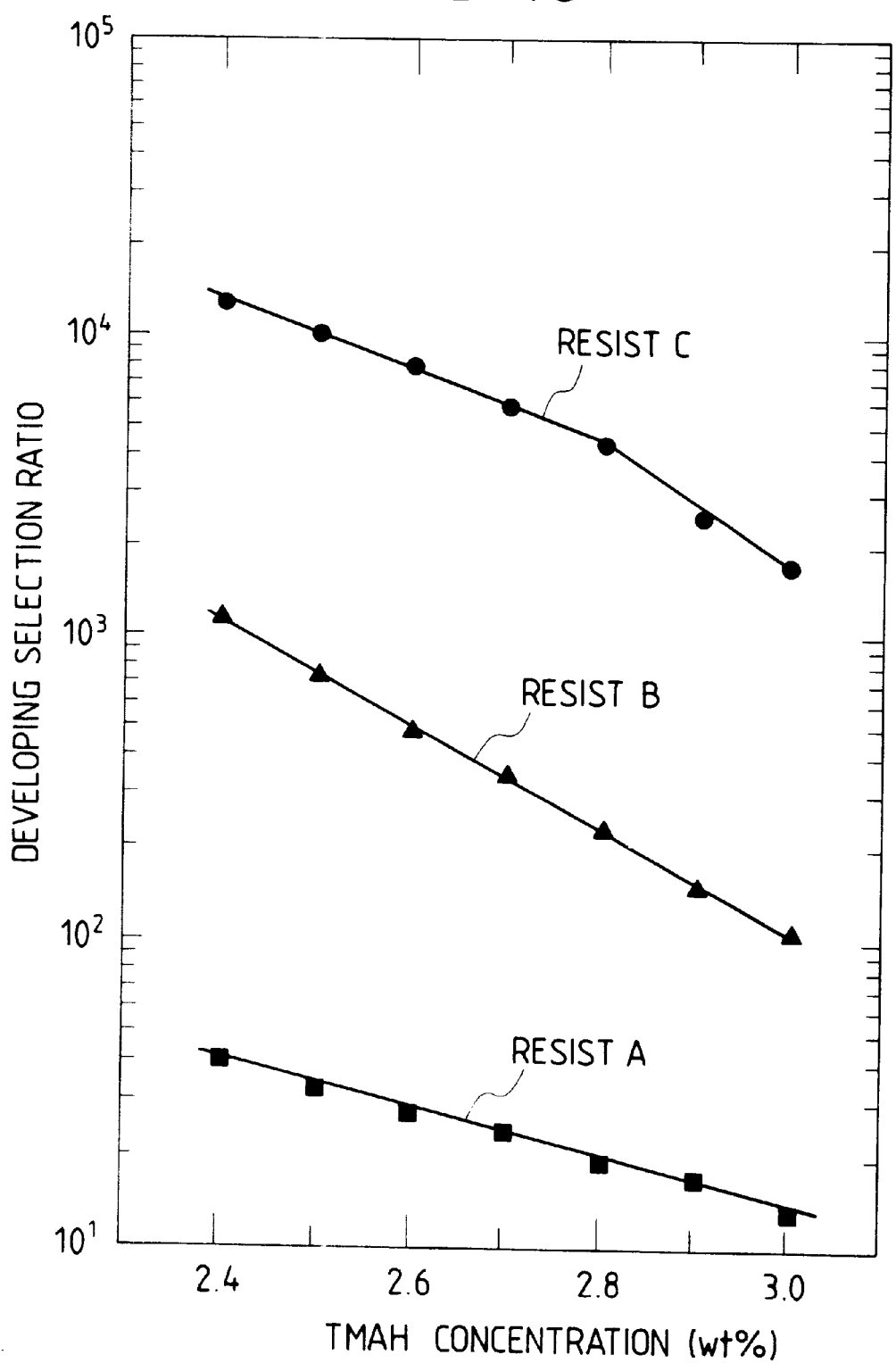
FIG. 16 is a graph showing the dependence of TMAH concentration on the selection ratio of a resist to a developer.
Figure 17:
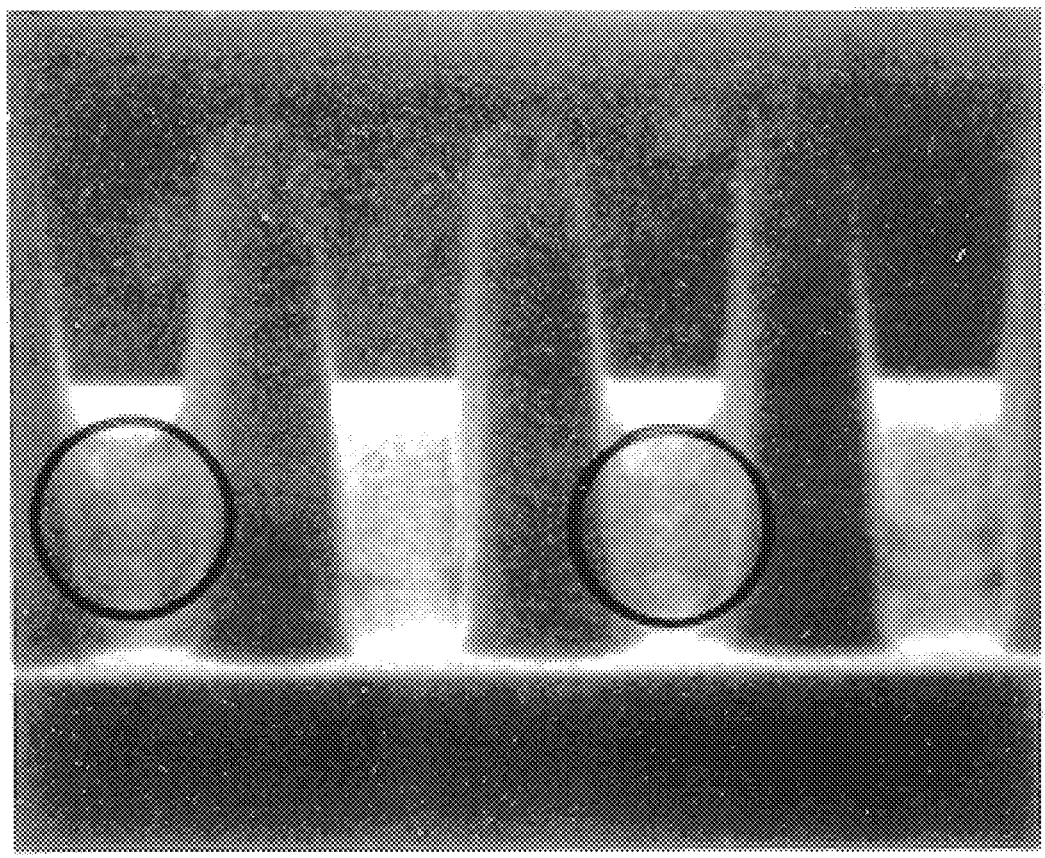
FIG. 17 is a photograph showing a 0.55 μm line-and-space pattern formed using a conventional developer.

The same developers as in Example 3 were used, except that the surfactant was added in different concentration. For comparison, contact holes were also similarly formed using a developer containing no surfactant. Scanning electron microscope photographs of resist patterns thus developed are shown in FIG. 15A (resist: MCPRi6600) and FIG. 15B (resist: THMRip1800). In FIGS. 15A–15L and 15M to 15X, "F-value" is the quantity that represents a focal position. In the case of the present Example, +0.7 μm indicates the best focal position.

As is clear from FIGS. 15A–15L and 15M to 15X, when contact holes are formed, the employment of the developer of the present Example enabled formation of sharp patterns even when defocused in a large quantity. It was found that, although only a focal margin of 0.5 μm was obtained in conventional cases, a focal margin as large as 1 μm was obtainable.

As described above, the lithographic developer and lithographic process of the present invention make it possible to develop a fine resist pattern having all regions with different sizes and shapes, as originally designed, in ultra large scale integration processing, and hence makes it possible to provide LSIs with much ultra-higher density and such ultra-higher speed.

What is claimed is:

1. A lithographic developer used to develop a resist pattern having regions with different sizes and shapes, by dissolving and removing a resist region of a resist layer formed in the resist pattern, wherein said developer comprises a basic solution of a surfactant of the formula I.

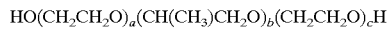

wherein a, b and c are each a positive integer, wherein said surfactant satisfies the expression:

$$(A+C)/(A+B+C) \leq 0.2$$

wherein A is a formula weight of the moiety $OH(CH_2CH_2)_a$, B is a formula weight of the moiety $(CH(CH_3)CH_2O)_b$, and C is a formula weight of the moiety $(CH_2CH_2O)_cH$ in the formula I and wherein said surfactant (a) has a molecular weight of not more than 4,000, (b) is present in a concentration from 400 ppm to 1,000 ppm and (c) is capable of increasing the dissolution of a resist in the resist region to be dissolved and removed, having a smaller dissolving-and-removing area on the surface of said resist layer.

* * * * *

UNITED STATES PATENT AND TRADEMARK OFFICE
CERTIFICATE OF CORRECTION

PATENT NO. : 6,007,970

DATED : December 28, 1999

INVENTOR(S) : TADAHIRO OHMI ET AL.

It is certified that error appears in the above-identified patent and that said Letters Patent is hereby corrected as shown below:

ON THE TITLE PAGE

[56] References Cited, under FOREIGN PATENT DOCUMENTS:
"1129250" should read --1-129250--.

IN THE DRAWINGS

Figure 18:
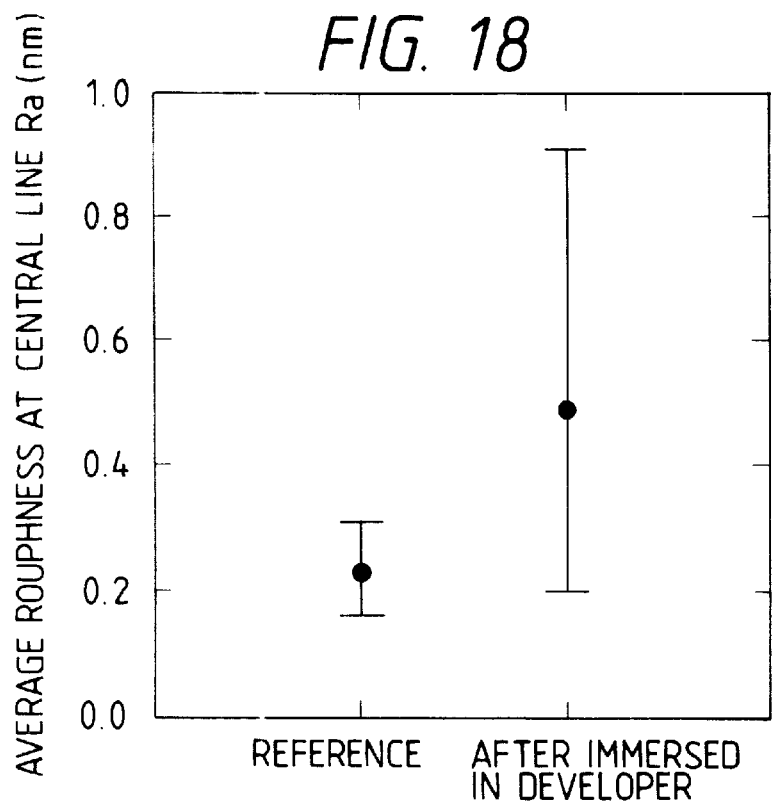
FIG. 18 is a graph showing a change in an average central line surface roughness of the silicon surface after immersed in a developer.
Figure 19:
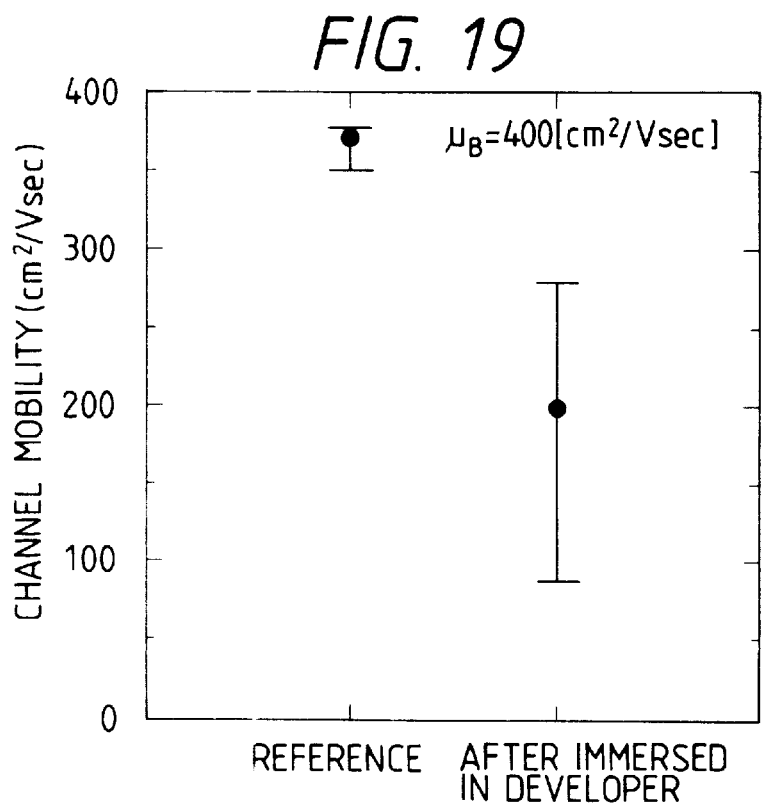
FIG. 19 is a graph showing a deterioration of channel mobility of a MOSFET, affected by a developer.
Figure 20:
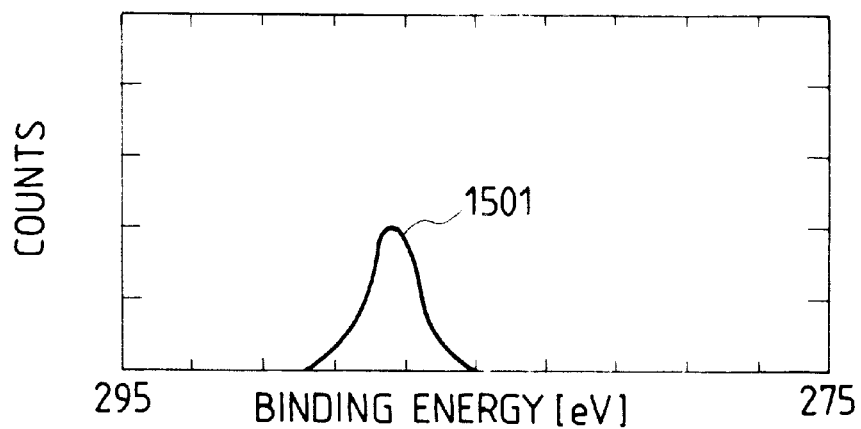
FIG. 20 is an XPS spectrum showing an adsorption of a surfactant on the surface of a silicon wafer.
Figure 22:
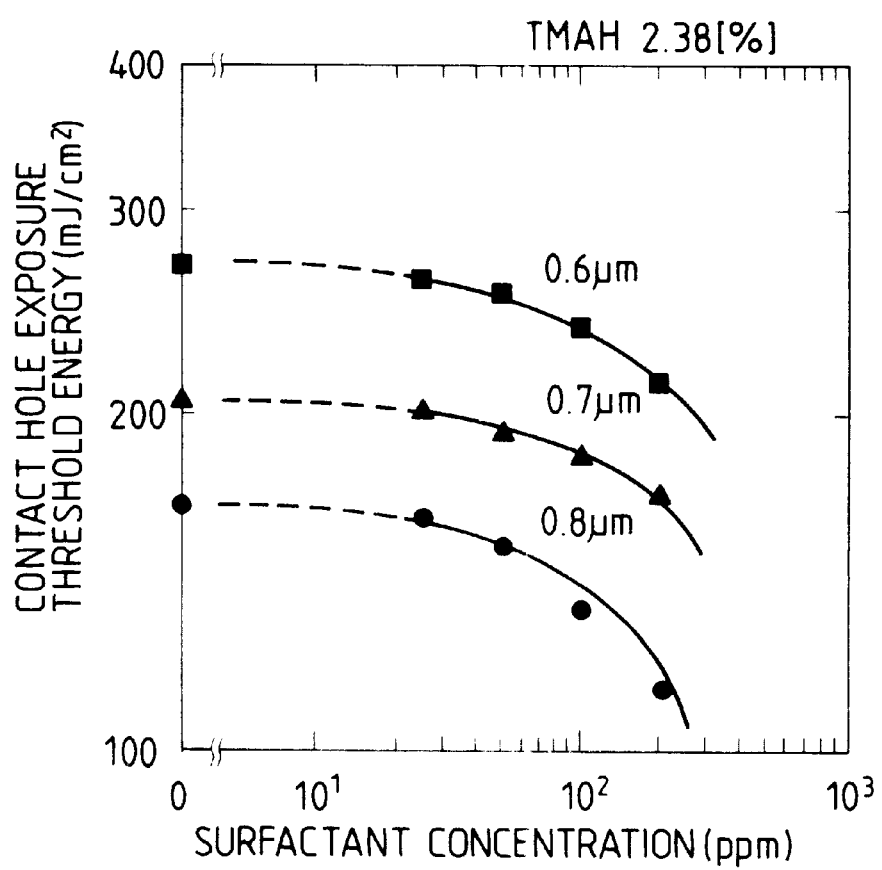
FIG. 22 is a graph showing the dependence of the exposure threshold energy for the formation of contact holes using a conventional developer, on the concentration of a surfactant added to the developer.

Sheet 18 of 21, FIG. 18, "ROUPHNESS" should read --ROUGHNESS--.

COLUMN 1:

Line 38, "increases" should read --increase--; and
Line 48, "the-resolution" should read --the resolution--.

Figure 23A:
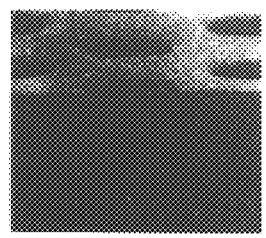
FIGS. 23A–23C show photographs showing contact holes formed using the developer containing a surfactant as shown in FIG. 22.
Figure 23B:
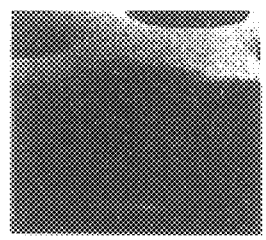
Figure 23C:
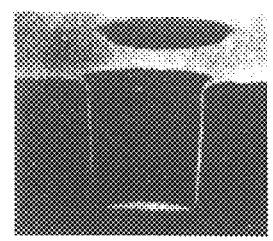

COLUMN 2:

Line 59, "Gas" should read --has--;
Line 63, "FIG. 23A-C" should read --FIG. 23A-23C--; and
Line 65, "FIG. 23A-C" should read --FIG. 23A-23C--.

COLUMN 3:

Line 7, "have" should read --has--.

COLUMN 4:

Line 58, "regist" should read --resist--.

UNITED STATES PATENT AND TRADEMARK OFFICE
CERTIFICATE OF CORRECTION

PATENT NO.    : 6,007,970

DATED         : December 28, 1999

INVENTOR(S)   : TADAHIRO OHMI ET AL.

It is certified that error appears in the above-identified patent and that said Letters Patent is hereby corrected as shown below:

COLUMN 5:

Line 50, "resit" should read --resist--.

COLUMN 6:

Line 7,  "propylene" should read --propylene-oxide--;
    Line 9,  "Increasing" should read --increasing--;
    Line 21, "illustrates" should read --illustrate--;
    Line 23, "hold" should read --hole--; and
    Line 49, "smaller" should read --small--.

COLUMN 7:

Line 4,  "regist" should read --resist--;
    Line 19, "finer" should read --fine--; and
    Line 24, "regist" should read --resist--.

COLUMN 9:

Line 5,  "as" should read --As--.

UNITED STATES PATENT AND TRADEMARK OFFICE
CERTIFICATE OF CORRECTION

PATENT NO. : 6,007,970

DATED : December 28, 1999

INVENTOR(S) : TADAHIRO OHMI ET AL.

It is certified that error appears in the above-identified patent and that said Letters Patent is hereby corrected as shown below:

COLUMN 10:

Line 9, "such" should read --much--.

Signed and Sealed this

Twenty-seventh Day of February, 2001

Attest:

NICHOLAS P. GODICI

Attesting Officer

Acting Director of the United States Patent and Trademark Office